United States Patent [19]
Penn

[11] Patent Number: 4,853,828
[45] Date of Patent: Aug. 1, 1989

[54] SOLID STATE DEVICE PACKAGE MOUNTING APPARATUS

[75] Inventor: Paul E. Penn, Indianapolis, Ind.

[73] Assignee: Dart Controls, Inc., Zionsville, Ind.

[21] Appl. No.: 145,396

[22] Filed: Jan. 19, 1988

Related U.S. Application Data

[62] Division of Ser. No. 768,318, Aug. 22, 1985, Pat. No. 4,756,081.

[51] Int. Cl.$^4$ ............................................. H05K 7/20
[52] U.S. Cl. .................................. 361/386; 165/80.3; 165/185; 174/16.3; 357/79; 357/81; 361/389; 363/141
[58] Field of Search ................. 174/16 HJ; 165/80.3, 165/185; 357/79, 81; 361/386–389; 363/141, 145–146

[56] References Cited

U.S. PATENT DOCUMENTS

| | | | |
|---|---|---|---|
| 3,697,814 | 10/1972 | Christman et al. | 361/388 |
| 4,254,301 | 3/1981 | Serino | 174/138 |
| 4,266,267 | 5/1981 | Ruegg | 361/386 |
| 4,342,068 | 7/1982 | Kling | 361/386 |
| 4,546,408 | 10/1985 | Rodseth et al. | 361/386 |
| 4,599,680 | 7/1986 | Gibson et al. | 361/386 |

*Primary Examiner*—A. D. Pellinen
*Assistant Examiner*—G. Thompson
*Attorney, Agent, or Firm*—Barnes & Thornburg

[57] ABSTRACT

Apparatus for mounting TO-220 solid state device packages on a heat sink. Each package includes an electrically conductive, heat dissipating, heat sinking tab which is common with one of the electrical terminals, and a resin case. The heat sinking tab includes an opening therethrough intended to be used in mounting the package to a heat sink. The apparatus comprises a printed circuit board mounted to the heat sink. An opening is provided in the board. The devices are adapted to be oriented during mounting so that they overlie the opening with their heat sinking tab sides facing toward the opening and their resin case sides facing away from the opening. A first bar of thermally conductive material is adapted to be positioned between the heat sink and the heat sinking tab sides of the packages and extending through the opening. A layer of electrically insulative and thermally conductive material is interposed between the bar and the heat sinking tab sides of the packages. A second bar of thermally conductive material is provided. Aligned passageways are provided through the second bar, the layer of electrically insulative and thermally conductive material, the first bar and the heat sink. Screws are positioned in the aligned openings but not so that the screws extend into the openings through the heat sinking tabs for clamping the packages in heat sinking orientation between the second bar and the layer of electrically insulative and thermally conductive material.

18 Claims, 1 Drawing Sheet

SOLID STATE DEVICE PACKAGE MOUNTING APPARATUS

This is a division of application Ser. No. 06/768,318 filed Aug. 22, 1985, now U.S. Pat. No. 4,756,081.

BACKGROUND OF THE INVENTION

This invention relates to apparatus for mounting solid state devices, and more particularly to such apparatus which permits effective heat sinking of power solid state devices mounted on a printed circuit board or the like.

Present techniques for mounting solid state devices contemplate either small clip-on type heat sinks clipped to the packages or "cans" housing the devices, as in the case of the small finned type heat sinks which are used with certain standard device packages, or the larger, extruded aluminum or aluminum alloy sinks to which devices are attached using screws or nuts and bolts, typically with mica insulators interposed between electrically conductive portions of the device package and the extrusion. In such cases, the bolt or screw which passes through an electrically conductive portion of the device package and through the extrusion must be insulated from one or the other of these to prevent inadvertent electrical contact between the device package and the extrusion. This is sometimes done with a grommet or sleeve of insulating material which is slipped onto the screw or bolt and a insulative material-type washer. As will be appreciated, this involves a fairly complicated assembly process. Additionally, distances between components, such as the electrically conductive portion of the package and the screw or nut and bolt which attach it to the extruded heat sink and the heat sink itself, are rather small. These distances cannot be very carefully regulated because of the assembly process required. Therefore, when high voltages appear on the electrically conductive components of the package, the possibility of arcing across these relatively small spaces, the exact length of which cannot be carefully controlled, becomes significant.

SUMMARY OF THE INVENTION

It is an object of the present invention to provide a simplified apparatus for mounting a solid state device package having a heat dissipating portion and an electrically insulative portion to a heat sink, such as a conventional aluminum or aluminum alloy extrusion.

According to the present invention, a mounting is provided for mounting a solid state device package having a heat dissipating portion and an electrically insulative portion to a heat sink. The mountain comprises a printed circuit board for making electrical contact to the device terminals. The board includes means defining an opening through the board adjacent the device mounting location, with the device being oriented on the board so that the heat dissipating portion of the device extends into alignment with the opening. Means are provided for mounting the board from the heat sink. The mounting further includes a first bar of heat conductive material, an electrically insulative and thermally conductive material for contacting the heat dissipating portion of the device and the first bar, a second bar of heat conductive material for contacting the electrically insulative portion of device, and threaded fastening means. Aligned passageways are provided through the second bar, the electrically insulative and thermally conductive material, the first bar and the heat sink for permitting insertion and adjustment of the threaded fastening means through the aligned passageways to clamp the device package between the second bar and the electrically insulative and thermally conductive material with its heat dissipating portion in heat conducting contact with the electrically insulative and thermally conductive material through the opening and its electrically insulative portion adjacent the second bar.

According to an illustrative embodiment, the package is a TO-220 package. The package heat sinking tab forms the heat dissipating portion of the package and the package's epoxy resin case encloses the active region of the device, forming the electrically insulative portion. Further, illustratively, the invention comprises pairs of TO-220 packages, and the aligned passageways through the second bar, the electrically insulative and thermally conductive material, the first bar and the heat sink are positioned between the intended locations of respective pairs of TO-220 device packages.

Illustratively, the first bar comprises a generally rectangular cross-section bar of metal. In the illustrated embodiment, the first bar comprises a generally square cross-section bar of aluminum or aluminum alloy.

According to an illustrative embodiment, the electrically insulative and thermally conductive material comprises a compressible, resilient flexible material. Illustratively, the material is a textile or textile-like material, such as Cho-Therm 1674 electrically insulative material, available from Chomerics Laminates, Inc., 77 Dragon Court, Woburn, Mass. 01888.

Also, illustratively, the second bar comprises a generally rectangular cross-section bar of metal. In the illustrated embodiment, the second bar comprises a bar of aluminum or aluminum alloy.

Additionally, according to an illustrative embodiment, the board is a generally rectangular phenolic or other type printed circuit board, and the means for mounting the board from the heat sink comprises means providing grooves on the heat sink for slidably receiving two opposite board edges and frictionally retaining the board on the heat sink.

BRIEF DESCRIPTION OF THE DRAWINGS

The invention may best be understood by referring to the following description and accompanying drawings which illustrate the invention. In the drawings.

DETAILED DESCRIPTION OF A PREFERRED EMBODIMENT

Figure 1:
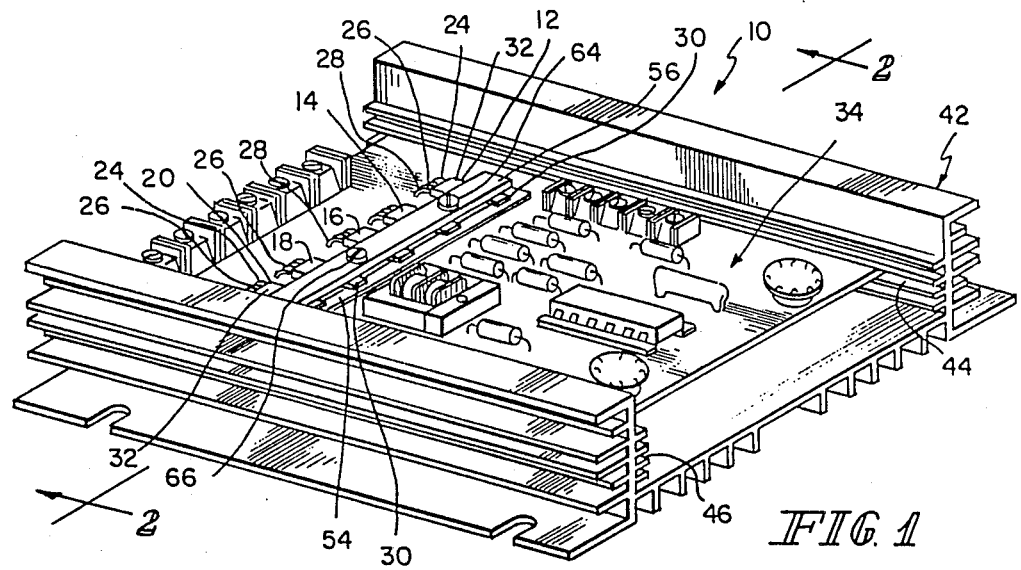
FIG. 1 is a perspective view of a device mounting embodying the apparatus of the present invention.

Turning to the drawings, a mounting 10 is provided for power solid state devices 12, 14, 16, 18, 20, 22 packaged in packages, such as TO-220 packages. Illustratively, devices 12, 14, 16, 18, 20, 22 are power FETs, such as Silconix Type IRF620SA or IRF640 FETs. Each device 12, 14, 16, 18, 20, 22 includes a complement of leads 24, 26, 28 which permit access to the device packaged in the package. Each device 12, 14, 16, 18, 20, 22 further includes a heat dissipating portion, such as a heat sinking tab 30. Heat sinking tab 30 typically is electrically and thermally conductive, and typically is the header upon which the solid state device itself is mounted. The tab 30 typically is at the voltage provided on one of the leads 24, 26, 28. Since the voltages on these leads are different for different devices in the same circuit, it will be appreciated that it is important to maintain the electrically insulated integrity of each heat sinking tab 30 from the heat sinking tabs 30 of the remaining devices, as well as from other adjacent circuit components. Each device 12, 14, 16, 18, 20, 22 also includes an electrically insulative portion, such as an epoxy resin body 32 which is molded around the leads 24, 26, 28, the active region of the device, and is typically molded to the heat sinking tab 30.

The leads 24, 26, 28 of each device 12, 14, 16, 18, 20, 22 are appropriately coupled to each other and to other circuit components on a printed circuit board 34 through which electrical contact is made to the device leads and through which electrical contact is made between the devices themselves and other active and passive circuit components mounted on the board 34. The illustrated printed circuit board 34 is printed on one side with the interconnecting circuit, and most of the active and passive circuit components, including devices 12, 14, 16, 18, 20, 22 are mounted on the unprinted side of the board 34.

The board 34 includes an elongated slot-like opening 36 adjacent the mounting locations for devices 12, 14, 16, 18, 20, 22. The devices 12, 14, 16, 18, 20, 22 are oriented in the circuit printed on board 34, and their leads 24, 26, 28 bent so that the heat sinking tab 30 of each device, 12, 14, 16, 18, 20, 22 extends generally into alignment with the opening 36.

Figure 2:
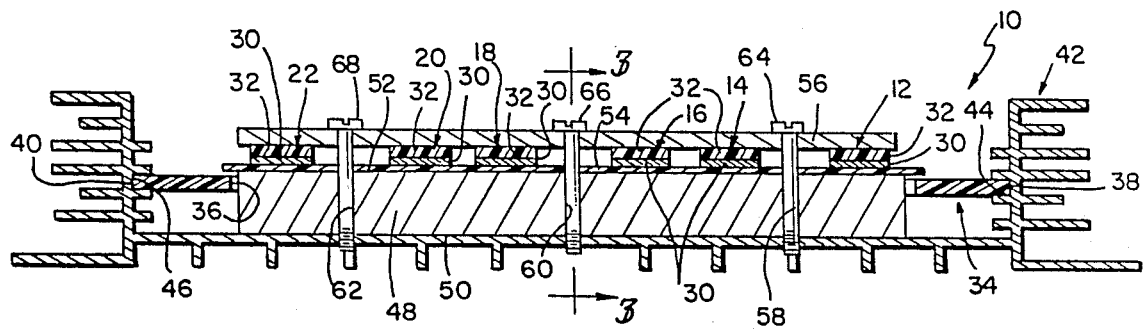
FIG. 2 is a sectional view of the apparatus of FIG. 1, taken generally along section lines 2—2 thereof.

The board 34 is generally rectangular, as illustrated in FIG. 1, and includes opposed parallel long side edges 38, 40. As best illustrated in FIG. 2, a heat sink 42 to which board 34 is mounted includes longitudinally extending grooves 44, 46 which slidably receive the side edges 38, 40, respectively and frictionally retain the board 34 on the heat sink 42.

Figure 3:
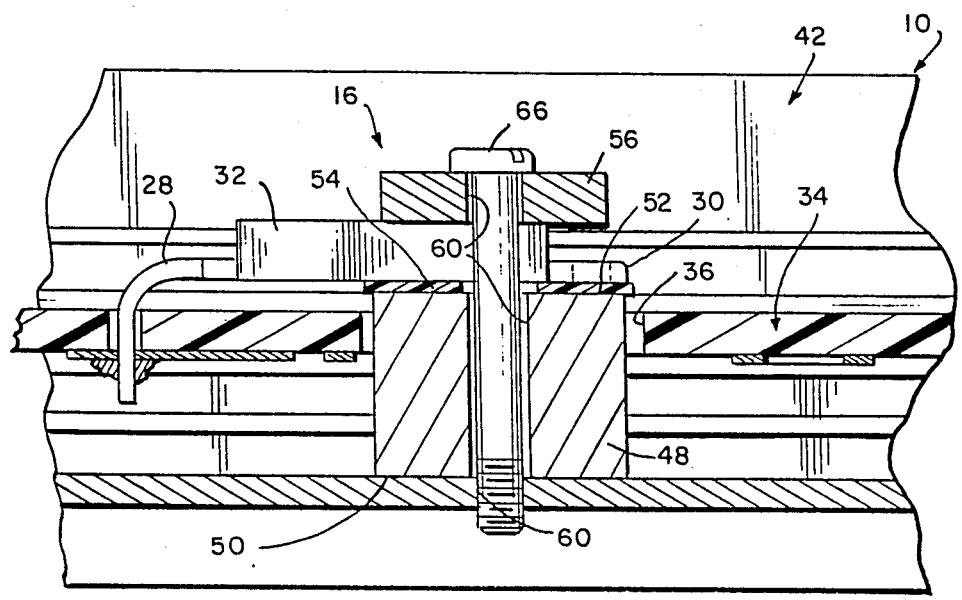
FIG. 3 is a fragmentary view of the apparatus of FIGS. 1-2, taken generally along section lines 3—3 of FIG. 2.

As best illustrated in FIG. 3, a first bar 48 of heat conductive material, illustratively aluminum or an aluminum alloy, is positioned on the heat sink 42 in alignment with the opening 36. Bar 48 is generally square in section perpendicular to its longitudinal extent, and includes a bottom face 50 in intimate thermally conductive contact with the heat sink 42, and a top face 52. An electrically insulative and thermally conductive material layer 54 is interposed between top face 52 of bar 48 and the heat sinking tabs 30 of devices 12, 14, 16, 18, 20, 22. Layer 54 is a layer of a slightly compressible, resilient flexible material, which can be a textile or textile-like material. The illustrative material is Cho-Therm 1674 electrically insulative and thermally conductive material available from Chomerics Laminates, Inc. This leaves the electrically insulative epoxy resin body portions 32 of devices 12, 14, 16, 18, 20, 22 facing upward, that is, away from the opening 36. A second bar 56 of thermally conductive material is laid over the epoxy resin bodies 32 of devices 12, 14, 16, 18, 20, 22. Bar 56 illustratively is an aluminum or aluminum alloy bar and has a generally rectangular cross-section.

Aligned passageways are provided through bar 56, the layer 54, bar 48 and the floor of the heat sink 42. Three such sets of aligned passageways 58, 60, 62 are provided, with aligned passageways 58 being provided between devices 12, 14; aligned passageways 60 being provided between devices 16, 18; and aligned passageways 62 being provided between devices 20, 22. The passageways in heat sink 42 are threaded. Screws 64, 66, 68 are inserted into aligned passageways 58, 60, 62, respectively and threaded into the passageways in heat sink 42.

The screws 64, 66, 68 are selectively tightened to insure thermal contact between tabs 30 of the devices and the layer 54, as well as between layer 54 and the top face 52 of bar 48. Additionally, thermal contact is maintained between the electrically insulative portions 32 of the devices and bar 56. The fastening technique, in which screws 64, 66, 68 are positioned between respective pairs 12, 14; 16, 18; and 20, 22 of the devices insures that any lack of flatness in either of bars 48, 56 can be compensated by selectively tightening the screws 64, 66, 68. The flow of heat across the various junctions in this mounting technique is aided by the slightly compressible and resilient nature of layer 54, against which the heat sinking tabs 30 lie in thermal contact. This same layer 54 provides the electrical insulation necessary to permit all of tabs 30 to lie on the layer 54 without electrically shorting tabs 30 together. The electrically insulative portions, epoxy resin bodies 32 of devices 12, 14, 16, 18, 20, 22 are also employed in this scheme, with electrical insulation between the devices being maintained while they are thermally connected by the clamping bar 56.

If a single side printed circuit board 34 is used, as is illustrated here, wave soldering techniques can be employed in the construction of the mounting 10. Additionally, insulation of the tabs 30, and therefore of the devices 12, 14, 16, 18, 20, 22 is achieved without the use of separate insulators, such as mica insulators and grommets or stand-offs which were standard prior art techniques, for insulating from the heat sink the screws which attach the heat sinking tabs 30 of the devices to the heat sink. The close tolerances which those prior art techniques required are therefore also avoided.

What is claimed is:

1. Apparatus for mounting on a heat sink a solid state device package housing a solid state device having multiple electric terminals, the device package having an electrically conductive, heat dissipating portion which is common with one of the electrical terminals and an electrically insulative portion, the electrically conductive and heat dissipating portion including an opening therethrough intended to be used in mounting the device package to a heat sink, the apparatus comprising a board for facilitating contact to the device terminals, the board including an opening therethrough adjacent the device mounting location, the device package adapted to be oriented so that the heat dissipating portion of the device package extends into alignment with the opening in the board, means for mounting the board to the heat sink, a first bar of heat conductive material, the first bar adapted to be oriented in the opening between the device package and the heat sink, an electrically insulative and thermally conductive material interposed between the first bar and the device package, a second bar of heat conductive material, the second bar adapted to be oriented on the electrically insulative and thermally conductive material, the first bar and the heat sink, fastening means for positioning in the aligned passageways but not so that the fastening means extends into the opening in the electrically conductive and heat dissipating portion of the device package, said fastening means clamping the device package in position between the electrically insulative and thermally conductive material and the second bar.

2. The apparatus of claim 1 wherein the device package is a TO-220 package including a heat sinking tab and a resin case enclosing an active region of the device, the package heat sinking tab forming the electrically conductive and heat dissipating portion and the package resin case forming the electrically insulative portion.

3. The apparatus of claim 1 wherein the first bar comprises a generally rectangular cross section bar of metal.

4. The apparatus of claim 3 wherein the first bar comprises a generally square cross-section bar of aluminum or aluminum alloy.

5. The apparatus of claim 3 wherein the electrically insulative and thermally conductive layer comprises a layer of a compressible, resilient flexible material.

6. The apparatus of claim 5 wherein the electrically insulative and thermally conductive layer comprises a layer of a textile material.

7. The apparatus of claim 5 wherein the second bar comprises a generally rectangular cross-section bar of metal.

8. The apparatus of claim 7 wherein the second bar comprises a bar of aluminum or aluminum alloy.

9. The apparatus of claim 2 comprising two TO-220 device packages, wherein the aligned passageways through the second bar, the electrically insulative and thermally conductive layer, the first bar and the heat sink are disposed between the intended locations of the TO-220 device packages.

10. Apparatus for mounting on a heat sink a TO-220 solid state device package housing a solid state device having multiple electrical terminals, the package including an electrically conductive, heat dissipating, heat sinking tab which is common with one of the electrical terminals and a resin case enclosing an active region of the device, the heat sinking tab including an opening therethrough intended to be used in mounting the package to a heat sink, the package having two opposed sides, one of said opposed sides being a resin case side on which the resin case of the package is exposed and the other of said opposed sides being a heat sinking tab side on which the heat sinking tab of the package is exposed, the apparatus comprising a printed circuit board, means for mounting the board to a heat sink, an opening in the board, the device adapted to be oriented during mounting so that it overlies the opening in the board with its heat sinking tab side facing toward the opening in the board and its resin case side facing away from the opening in the board, a first bar of thermally conductive material, the first bar adapted to be positioned between the heat sink and the heat sinking tab side of the package and extending through the opening in the board, a layer of electrically insulative and thermally conductive material adapted to be interposed between the bar and the heat sinking tab side of the package, a second bar of thermally conductive material, aligned passageways through the second bar, the layer of electrically insulative and thermally conductive material, the first bar and the heat sink, threaded attachment means for positioning in the aligned passageways but not so that the threaded attachment means extends into the opening through the heat sinking tab, said threaded attachment means clamping the package in heat sinking orientation between the second bar and the layer of electrically insulative and thermally conductive material.

11. Apparatus for mounting on a heat sink a solid state device package housing a solid state device having multiple electrical terminals, the device package having an electrically conductive, heat dissipating portion which is common with one of the electrical terminals, the electrically conductive and heat dissipating portion including an opening therethrough intended to be used in mounting the device package to a heat sink, the apparatus comprising a board for facilitating contact to the device terminals, an electrically insulative and thermally conductive material interposed between the heat sink and the device package, a clamping member of heat conductive material, means for mounting the baord to the heat sink, means for electrically insulating the clamping member from the electrically conductive and heat dissipating portion of the device package, the clamping member adapted to be oriented on the means for electrically insulating the clamping member from the electrically conductive and heat dissipating portion of the device package, aligned passageways through the clamping member, the electrically insulative and thermally conductive material, and the heat sink, fastening means for positioning in the aligned passageways but not so that the fastening means extends into the opening in the electrically conductive and heat dissipating portion of the device package, said fastening means clamping the device package in position between the electrically insulative and thermally conductive material and the clamping member.

12. The apparatus of claim 11 wherein the fastening means comprises a threaded fastener and a threaded opening in the heat sink receives the threaded fastener to attach the clamping member to the heat sink in device package clamping orientation.

13. The apparatus of claim 11 wherein the device package is a TO-220 package including a heat sinking tab and a resin case enclosing an active region of the device, the package heat sinking tab forming the electrically conductive and heat dissipating portion and the package resin case forming the means for electrically insulating the clamping member from the electrically conductive and heat dissipating portion of the device package.

14. The apparatus of claim 11 wherein the electrically insulative and thermally conductive layer comprises a layer of a resilient flexible material.

15. The apparatus of claim 14 wherein the electrically insulative and thermally conductive layer comprises a layer of a textile material.

16. The apparatus of claim 11 wherein the clamping member comprises a generally rectangular cross-section bar of metal.

17. The apparatus of claim 16 wherein the clamping member comprises a bar of aluminum or aluminum alloy.

18. The apparatus of claim 13 comprising two TO-220 device packages, wherein the aligned passageways through the clamping member, the electrically insulative and thermally conductive layer, and the heat sink are between the intended locations of the TO-220 device packages.

* * * * *

UNITED STATES PATENT AND TRADEMARK OFFICE
CERTIFICATE OF CORRECTION

PATENT NO. : 4,853,828

DATED : August 1, 1989

INVENTOR(S) : Paul E. Penn

It is certified that error appears in the above-identified patent and that said Letters Patent is hereby corrected as shown below:

At column 3, line 3, please delete "The" and insert therefor --Thus--;

At column 4, line 63, after the word "insulative", please insert --portion of the device package, aligned passageways through the second bar, the electrically insulative--; and At column 6, line 16, please delete "baord" and insert therefor --board--.

Signed and Sealed this

Twenty-ninth Day of May, 1990

*Attest:*

HARRY F. MANBECK, JR.

*Attesting Officer*        *Commissioner of Patents and Trademarks*